United States Patent [19]

Schmidt

[11] 4,271,714
[45] Jun. 9, 1981

[54] DRIVE MECHANISM
[75] Inventor: Hans Schmidt, Wood Dale, Ill.
[73] Assignee: Matsushita Electric Corporation of America, Franklin Park, Ill.
[21] Appl. No.: 39,515
[22] Filed: May 16, 1979
[51] Int. Cl.³ .................... F16H 15/00; F16H 13/00
[52] U.S. Cl. ....................................... 74/202; 74/209
[58] Field of Search ................ 74/202, 206, 207, 208, 74/209; 267/150

[56]  References Cited
U.S. PATENT DOCUMENTS

| | | | |
|---|---|---|---|
| 465,570 | 12/1891 | Tremper | 74/202 |
| 1,787,571 | 1/1931 | Edwards | 74/202 |
| 2,200,574 | 5/1940 | Davis | 74/202 |
| 2,418,541 | 4/1947 | Camras | 74/206 X |
| 2,823,546 | 2/1958 | Barrett | 74/206 X |
| 3,232,128 | 2/1966 | Randolph et al. | 74/202 |
| 3,356,357 | 12/1967 | Levine | 267/150 |
| 3,528,309 | 9/1970 | Laybourn | 74/202 |
| 3,802,665 | 4/1974 | Fawcett | 254/150 R |
| 3,949,617 | 4/1976 | Baldoni | 74/206 |
| 3,968,942 | 7/1976 | Wrobel et al. | 74/207 X |

Primary Examiner—C. J. Husar
Assistant Examiner—Moshe I. Cohen
Attorney, Agent, or Firm—LaValle D. Ptak

[57] ABSTRACT

A self reversing drive mechanism is disclosed for providing a reversible speed reducing drive between a drive shaft and the rotary tuner mechanism of a television receiver. The drive mechanism comprises an idler wheel freely pivotally mounted about the drive shaft and in engagement with it. The idler wheel has a circumference which is greater than the distance between the drive shaft and the driven member of the rotatable tuner. As a result, the idler wheel mechanism rotates about the drive shaft in either direction until itself engages with the driven member of the rotary tuner. This is done without any additional external forces to accomplish tight engagement of the idler wheel between the drive shaft and the driven member.

3 Claims, 9 Drawing Figures

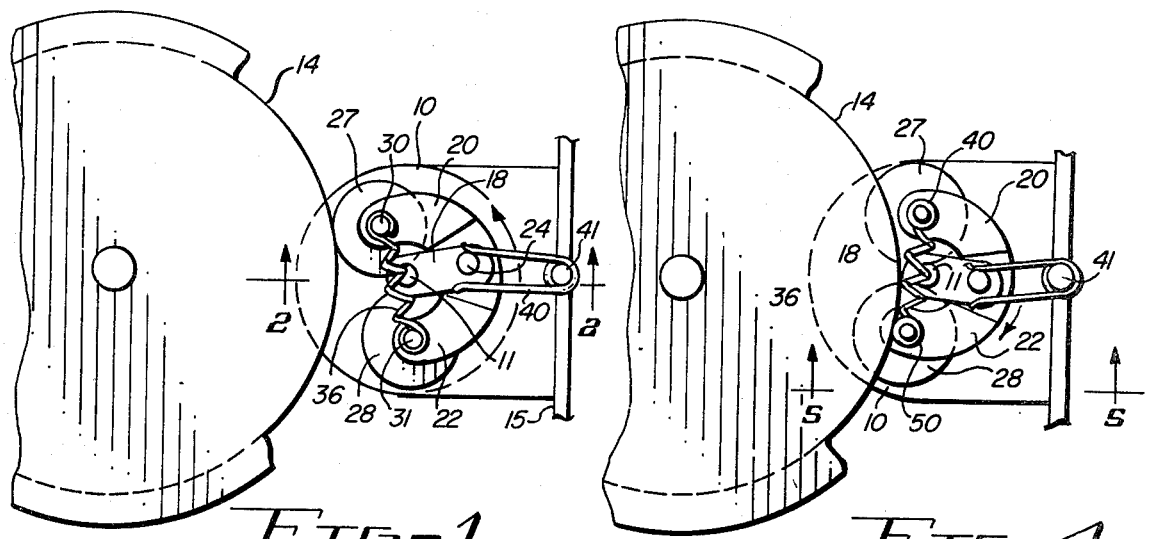
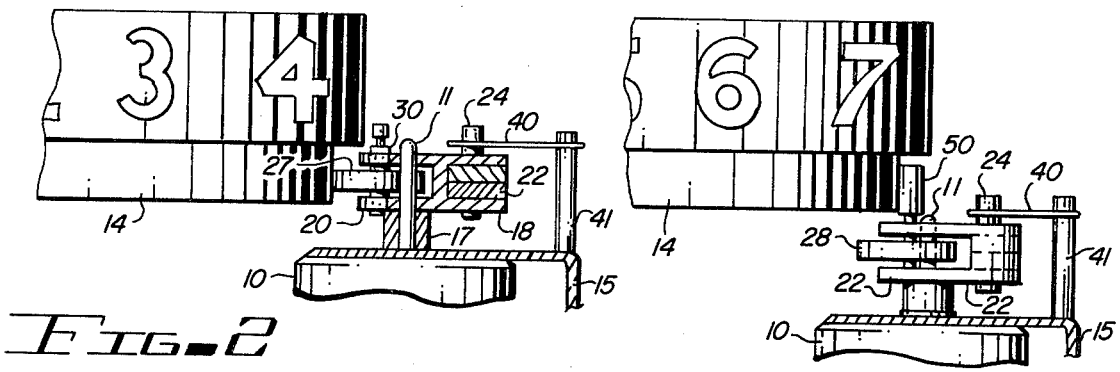
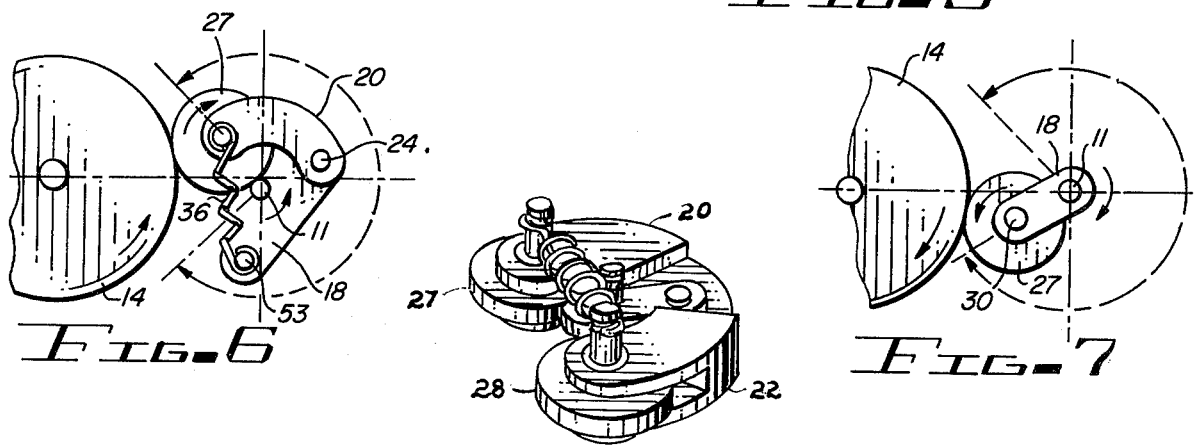
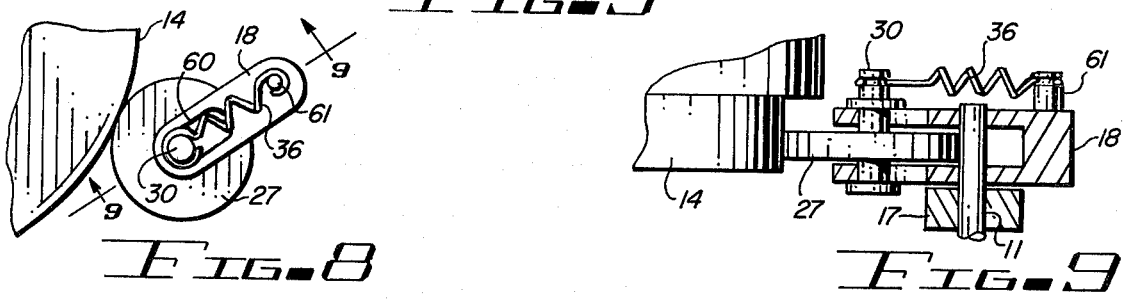

DRIVE MECHANISM

BACKGROUND OF THE INVENTION

Drive mechanisms are used in a wide variety of applications for coupling the rotary drive of a small rapidly turning motor with a rotary driven member, such as a turret tuning mechanism or indicator for television tuners, signal seek radio tuners, and the like. Such systems require substantial speed reduction between the speed of rotation of the motor shaft and the driven member. Various approaches have been used in the past to accomplish this speed reduction, usually by worm gear speed reducing drive units or multiple gear train units. Mechanisms of both of these types are subject to considerable wear over the life of the units. Frequently, the wear results in failure of the units to operate properly, requiring their replacement or servicing, neither of which is desirable. In the case of worm gear drive mechanisms, a substantial amount of force or torque is necessary to drive them. In addition, when gear reduction units or worm gear drive units are assembled, it is necessary to effect the assembly of the entire unit between the drive motor shaft and the driven member with a fair degree of precision.

Efforts have been made in the past to overcome the disadvantages of gear train and worm gear speed reduction drive systems, and one such solution which has been proposed is disclosed in U.S. Pat. No. 3,232,128 issued Feb. 1, 1966 to Randolph, et al. This patent discloses an apparatus in which a drum to be driven encircles a pair of idler wheels each held in continuous friction contact with a reversible motor driveshaft. A clutch mechanism is utilized to move the idler wheels in a plane normal to their axis into and out of frictional contact with the inner periphery of the drum to be driven. The rotation of the idler wheels from the drive shaft then causes the drum to rotate. The direction of rotation depends upon the direction of rotation of the driveshaft. In one direction, one of the idler wheels is moved into tighter engagement with the drum to act as the driving idler while the other idler wheel moves out of engagement with the drum, and vice-versa for a reversal of the rotation direction of the driveshaft. The mechanism of this patent requires an additional clutch or spring bias to force the idler wheels into engagement with the drum, and the resultant apparatus is relatively complex.

Accordingly, it is desirable to provide an inexpensive, effecient and simple self-reversing speed reducing drive mechanism which overcomes the disadvantages of prior systems, including the system disclosed in the Randolph, et al patent.

SUMMARY OF THE INVENTION

Accordingly, it is an object of this invention to provide an improved drive mechanism.

It is another object of this invention to provide an improved drive mechanism of the self-reversing speed-reducing type.

It is an additional object of this invention to provide an improved frictional drive mechanism requiring a minimum number of parts.

It is a further object of this invention to provide an improved drive mechanism which inherently compensates for variations in manufacturing tolerances and wear of the parts of the mechanism over its useful life.

It is still another object of this invention to provide a self-engaging speed-reducing drive mechanism between a drive shaft and a rotatable driven member.

In accordance with the preferred embodiment of this invention, a self-engaging drive mechanism comprises a rotatable drive member and a rotatable driven member having a driven surface which is spaced a fixed distance from the drive member. An idler wheel having a circumference which is greater than the fixed distance between the driven surface of the driven member and the drive member is mounted in engagement with the drive member for free pivotal movement about the axis of the drive member to be driven thereby.

BRIEF DESCRIPTION OF THE DRAWINGS

FIG. 1 shows a top view of a preferred embodiment of the invention;

FIG. 2 is a partially cut away side view of the embodiment of FIG. 1;

FIG. 3 is a perspective view of the embodiment shown in FIGS. 1 and 2;

FIG. 4 shows an alternative embodiment of the invention;

FIG. 5 is a partially cut away side view of the embodiment shown in FIG. 4;

FIGS. 6, 7 and 8 show alternative embodiments of the invention; and

FIG. 9 is a partially cut away side view of the embodiment shown in FIG. 8.

DETAILED DESCRIPTION

Reference now should be made to the drawing in which the same or similar components in the various figures are designated by the same reference numbers.

Reference first should be made to the embodiment shown in FIGS. 1, 2 and 3. In these figures, the use of a preferred embodiment of the invention to act as a self-reversing speed-reducing drive mechanism between the output drive shaft 11 of a motor 10 and a channel number display drum 14 of a television tuner is illustrated. The motor 10 and the drum 14, which forms part of a television tuner (not shown) are both mounted in the relative positions shown in FIGS. 1, 2 and 3 in the chassis (not shown) of a television receiver. A portion 15 of this frame is shown to which the motor 10 is attached. The shaft 11 of the motor 10 extends upwardly (as viewed in FIG. 2) through a spacing bushing 17, on which an elongated lever 18 is pivotally mounted by slipping the shaft 11 through a hole in the lever 17 at its leftmost end, as viewed in FIGS. 1 and 2.

The lever arm 18 has a generally "H" shaped cross section as seen most clearly in FIG. 2, with the "H" tipped over. The shaft 11 passes freely through holes or openings in the two legs of the "H" as shown in FIG. 2, so that the lever 18 is free to rotate about the drive shaft 11 of the motor 10. Whenever the lever 18 is held in a fixed position, the shaft 11 of the motor freely rotates within this opening.

Two other lever arm extensions 20 and 22 are pivotally attached by a pivot pin 24 to the lever arm 18 at its right-hand end, as shown in FIGS. 1 and 2. Each of the lever extensions 20 and 22 is shown having an arcuate shape, but the particular shape used is not significant. The lever extensions 20 and 22 are free for limited rotational movement about the pin 24, and at the right hand end of the extensions 20 and 22 (as seen in FIGS. 1 and 2) each extension is cut out to overlap the other within the opening of the two left hand legs of the "H" shaped lever 18.

At the opposite ends of the extensions 20 and 22, a pair of idler wheels 27 and 28, respectively, are mounted between bifurcations in the extensions. Each of the wheels 27 and 28 is suitably mounted on a bearing, with the axis or shaft of each wheel passing through the appropriate one of the extensions 20 and 22. For the wheel 27, the shaft 30 passes through the leftmost end of the extension 20, and for the wheel 28, the shaft 31 passes through and is held in the leftmost end of the extension 22.

The wheels 27 and 28 are free to rotate with respect to the lever extensions 20 and 22 in which they are held. Preferably, the idler wheels 27 and 28 are made of resilient material having a good frictional engaging surface on the outer circumference. This engaging surface may be integrally formed with the wheels 27 and 28 or it may be a surface added onto the periphery of these wheels in the form of a rubber O-ring or the like.

A coil spring 36 then is hooked at opposite ends to notches in the extensions of the shafts 30 and 31 to pull the idler wheels 27 and 28 toward one another into engagement with the drive shaft 11 of the motor 10, as illustrated most clearly in FIG. 1. The limited movement of the lever extensions 20 and 22, relative to the central lever 18, permits this contact with the drive shaft 11 to be made, irrespective of variations in the diameters of the wheels 27 and 28 or with respect to manufacturing tolerance variations or wear of the idler wheels 27 and 28 as the unit is used. Thus, no close manufacturing tolerances need to be observed in assembling the unit onto the drive shaft of the motor 11.

The diameter of the idler wheels 27 and 28 is selected to be less than the distance between the periphery of the drive surface of the drum 14 and the outer surface of the drive shaft 11. This is clearly shown in FIG. 1. Consequently, when the drive shaft 11 of the apparatus as shown in FIGS. 1 and 2 is rotated in a counterclockwise direction, it tends to rotate the entire assembly, comprising the lever arm 18, the auxiliary lever arm extensions 20 and 22 and the idler wheels 27 and 28, with it in a counterclockwise direction. This takes place until the circumference of the idler wheel 27 engages the drive surface of the drum 14. At this point, continued rotation of the lever arm assembly is prevented. The idler wheel 27, however, then is driven in a clockwise direction (as viewed in FIG. 1) to drive the drum 14 in a counterclockwise direction.

The apparatus is self engaging since the idler wheel 27 tends to tightly wedge itself between the shaft 11 of the motor 10 and the periphery of the drum 14. As the distance between the periphery of the drum 14 and the drive shaft 11 is increased, the torque or coupling effect between the two which is brought about by the idler wheel 27 increases. Decreasing this distance has the opposite effect. In the high torque mode, the idler wheel 27 tends to wedge itself fairly tightly between the drive shaft 11 and the periphery of the drum 14 so that a greater disengagement force is required.

When the direction of rotation of the shaft of the motor 11 is reversed to a clockwise rotational direction, the entire assembly of the levers 18, 20, and 22 along with the idler wheels 27 and 28, rotates in the same direction (clockwise) with the shaft 11 until the idler wheel 28 engages the surface of the drum 14. At this point, the lever and idler wheel assembly ceases to rotate; and the idler wheel 28 is rotated in a counterclockwise rotation to rotate the drum 14 in a clockwise direction. In all other respects the operation for rotating the drum 14 through th idler wheel 28 is the same as that described above in conjunction with the rotation effected through the idler wheel 27.

If the unit is to be used in a television tuner having a capability of manual tuning as well as the motor driven apparatus described above, it is desirable to disengage both of the idler wheels 27 and 28 from the periphery of the drum 14 when the motor 10 is off. To accomplish this, a fairly weak "U" shaped leaf spring 40 is mounted on a pin 41 attached to the frame 15 shown in FIGS. 1 and 2. The two arm extensions of the spring 40 are on opposite sides of the upper extension of the pin 24; so that when the apparatus is rotated to the position shown in FIG. 1; the pin 24 pushes against the upper (as shown in FIG. 1) arm of the spring 40. This produces a downward biassing force on the pin 24. When the apparatus is rotated in the opposite direction, with the idler wheel 28 in engagement with the drum 14, the opposite occurs and the pin 24 is biassed upwardly by the lower leaf extension of the spring 40. Whenever the motor is stopped so that the shaft 11 does not rotate, one or the other of the extensions of the leaf spring 40 push on the pin 24 to disengage the previously engaged idler wheel 27 or 28 from the surface of the drum 14. The drum 14 then may be freely rotated without interference from either idler wheel.

FIGS. 4 and 5 illustrate an alternative embodiment of the apparatus shown in FIG. 1 for effecting a greater speed reduction between the rotation of the motor shaft 11 and the output drive speed applied to the periphery of the drum 14. The apparatus shown in FIGS. 4 and 5 is essentially the same as the one described above in conjunction with FIGS. 1, 2, and 3, except that the idler wheels 27 and 28 do not engage the drum 14. Instead, extensions of the shafts 30 and 31 carry a small diameter (relative to the idler wheels 27 and 28) drive members 49 and 50, respectively, which engage the drum 14, as shown most clearly in FIG. 5. This arrangement provides a greater speed reduction between the speed of rotation of the motor drive shaft 11 and the speed of rotation of the drum 14. In all other respects the operation of the device shown in FIGS. 4 and 5 is the same as that described above previously in conjunction with FIGS. 1, 2 and 3. In FIGS. 4 and 5, the apparatus is shown in engagement in the position it assumes when the motor drive shaft 11 is rotating in a clockwise direction, as contrasted to the counterclockwise direction illustrated FIGS. 1, 2, and 3.

FIG. 6 shows an alternative embodiment to that illustrated in FIG. 1, where only a single idler wheel 27 mounted on a hinged pair of lever arms 18 and 20 is employed in place of the dual idler wheel arrangement of FIG. 1. The operation of the device in FIG. 6 is the same as that described above in conjunction with FIG. 1, with the exception that when the rotation of the motor shaft 11 is reversed from the counterclockwise direction as illustrated in FIG. 6 to a clockwise direction, the entire assembly moves in the direction of the dotted arrow to the point where the idler wheel 27 engages the surface of the drum 14 along the dotted center line indicated on the lower side of FIG. 6. This results in a greater backlash than is encountered with the use of the two idler wheels 27 and 28 in the apparatus of FIG. 1; but the operation in all other respects is exactly the same. The system rotates the entire assembly of the lever arms 18 and 20 and the idler wheel 27 in whichever direction the motor drive shaft 11 is rotated until the idler wheel 27 engages the periphery of the drum 14. At that point, rotation of the lever arms 18 and 20 terminates; and a firm engagement of the idler wheel 27 between the drive shaft 11 and the driven drum 14 is effected by the inherent tendency of the idler wheel 27 to wedge itself between the drive shaft 11 and the drum 14. This is true of either of the two directions of rotation of the shaft 11.

To provide an accomodation for the biasing spring 36, the lever arm 18 of the embodiment in FIG. 6 is modified to a generally triangular shape. A mounting pin 53 is provided to attach the lower end of the spring 36 to the lever arm 18 since the lever arm 22 and the associated extension of the shaft 31 for the idler wheel 28 of the embodiment shown in FIG. 1 is not present in the modification shown in FIG. 6.

FIG. 7 illustrates a modification of the embodiment of the apparatus in FIG. 6 to a very simple mechanical form. In the apparatus in FIG. 7, the idler wheel 27 is mounted directly on the end of the lever arm 18 which, in the embodiments of FIGS. 1 thru 6, has the pivot pin 24 mounted on it. In place of the pivot pin 24, in the embodiment of FIG. 7, the shaft 30 of the idler wheel 27 is mounted. Fairly close tolerance must be maintained between the location of the shaft 30 and the hole in the lever arm 18 which accomodates the drive shaft 11 in the embodiment of the FIG. 7 to maintain a snug or firm driving engagement between the periphery of the idler wheel 27 and the shaft 11. No biassing spring is included to accomodate for manufacturing tolerances or wear variations.

The operation of the device in FIG. 7, however, is the same as that described above in conjunction with FIG. 6; and rotation of the drive shaft 11 in either direction rotates the assembly comprising the lever arm 18 and the idler wheel 27 in that same direction until the idler wheel 27 engages the periphery of the drum 14. At that point, the idler wheel 27 is rotated by the drive shaft 11 to apply driving power to the periphery of the drum 14 with a tendency of the idler wheel 27 to wedge itself tightly between the drive shaft 11 and the drum 14 to effect a firm positive driving engagement.

In FIGS. 8 and 9, another variation of the embodiment shown in FIG. 7 is illustrated. In this embodiment, a single lever arm 18 along with a single idler wheel 27 is employed as in FIG. 7. The shaft 30 of the idler wheel 27, however, is located in an elongated slot 60 to permit limited movement of the shaft and the idler wheel 27 longitudinally of the lever arm 18. The lever arm 18 is extended to the right (as viewed in FIGS. 8 and 9) of the location of its mounting on the drive shaft 11. This extension is seen most clearly in FIG. 9. At the end of this extension, a spring mounting post 61 is attached; and the spring 36 is stretched between the mounting post 61 and an extension of the shaft 30 of the idler wheel 27. Thus, the idler wheel 27 is pulled into firm engagement with the drive shaft 11 of the motor in a manner similar to the other embodiments described above in conjunction with FIGS. 1 thru 6. The operation of the device shown in FIGS. 8 and 9 is the same as that described above in conjunction with the other embodiments and most closely resembles the operation of the devices shown in FIGS. 6 and 7.

The invention has been described in conjunction with the embodiments shown in the various figures of the drawing which illustrate different implementations of the invention. These different embodiments are to be considered only as illustrative of the invention and are not to be considered as limiting. Various changes and modifications will occur to those skilled in the art without departing from the true scope of the invention.

I claim:

1. A drive mechanism including in combination:
   a rotatable drive member having a drive shaft;
   a rotatable driven member having a driven surface and mounted for rotation in a position relative to said rotatable drive member so that the driven surface thereof is spaced a predetermined distance from said drive member;
   first and second idler wheels each having a circumference greater than said predetermined distance and each having a shaft;
   first, second, and third lever means each having first and second ends, with the second ends of each of said first, second, and third lever means being pivotally mounted together, the first end of said first lever means having the drive shaft of said rotatable drive member extending through an opening therein, and the first end of each of said second and third lever means having the shafts respectively of said first and second idler wheels rotatably mounted therein, said second and third lever means having the first ends thereof located on opposite sides of the first end of said first lever means;
   resilient spring means provided between the first ends of second and third lever means for urging said first and second idler wheels into engagement with said drive member for free pivotal movement about said drive member when said first and second idler wheels are out of engagement with said rotatable driven member; and
   whereby rotation of said rotatable drive member in a first direction causes said first, second, and third lever means to rotate in a first direction until said first idler wheel engages the driven surface of said rotatable driven member and whereby rotation of said rotatable drive member in the opposite direction causes said first, second, and third lever means to rotate about said rotatable drive member in the opposite direction until said second idler wheel engages the driven surface of said rotatable driven member.

2. The combination according to claim 1 further including means for centering said first and second idler wheels out of engagement with said driven member when said drive shaft is not rotating.

3. The combination according to claim 2 wherein said centering means comprises a bifurcated centering spring.

* * * * *